（12）United States Patent
Tokuda et al.

(10) Patent No.: US 10,931,193 B2
(45) Date of Patent: Feb. 23, 2021

(54) VOLTAGE SUPPLY CIRCUIT AND RADIO-FREQUENCY CIRCUIT MODULE

(71) Applicant: Murata Manufacturing Co., Ltd., Kyoto (JP)

(72) Inventors: Masamichi Tokuda, Kyoto (JP); Makoto Tabei, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/735,040

(22) Filed: Jan. 6, 2020

(65) Prior Publication Data

US 2020/0144912 A1     May 7, 2020

Related U.S. Application Data

(63) Continuation of application No. PCT/JP2018/023605, filed on Jun. 21, 2018.

(30) Foreign Application Priority Data

Jul. 6, 2017    (JP) .............................. JP2017-132397

(51) Int. Cl.
*H02M 3/07*      (2006.01)
*H02M 7/538*     (2007.01)
(Continued)

(52) U.S. Cl.
CPC .............. *H02M 3/07* (2013.01); *H02M 7/538* (2013.01); *H03K 17/04* (2013.01); *H03K 17/0412* (2013.01); *H03K 17/693* (2013.01)

(58) Field of Classification Search
CPC ........ H02M 3/07; H02M 7/538; H02M 1/088; H02M 2003/071; H03K 17/06;
(Continued)

(56) References Cited

U.S. PATENT DOCUMENTS 6,791,374 B1    9/2004   Allott
10,103,726 B2 * 10/2018   Wilz ....................... H02M 3/07
(Continued)

FOREIGN PATENT DOCUMENTS

JP     H10-232723 A     9/1998
JP     2003-168963 A    6/2003
(Continued)

OTHER PUBLICATIONS

International Search Report for International Application No. PCT/JP2018/023605 dated Aug. 14, 2018.
(Continued)

*Primary Examiner* — Emily P Pham
(74) *Attorney, Agent, or Firm* — Pearne & Gordon LLP

(57) ABSTRACT

A voltage supply circuit includes a level shifter that switches between voltages of two voltage input units and that outputs one of the voltages, a charge pump that transforms a voltage of an input power supply and that applies the transformed voltage to the level shifter, and a charge pump control circuit. The voltage supply circuit controls supply and interruption of a predetermined voltage to a voltage-supplied circuit (RF switch 20). The charge pump control circuit causes the charge pump to perform a continuous operation in an on-mode and to perform an intermittent operation in an off-mode, the off-mode representing a state in which the voltage supply to the voltage-supplied circuit (RF switch 20) is stopped, the on-mode representing a state in which the predetermined voltage is supplied.

16 Claims, 8 Drawing Sheets

(51) Int. Cl.
*H03K 17/04* (2006.01)
*H03K 17/0412* (2006.01)
*H03K 17/693* (2006.01)

(58) Field of Classification Search
CPC .... H03K 17/687; H03K 17/693; H03K 17/04; H03K 17/0412; H04B 1/401
See application file for complete search history.

(56) References Cited

U.S. PATENT DOCUMENTS

| | | |
|---|---|---|
| 2005/0007178 A1 | 1/2005 | Fahim |
| 2014/0092656 A1 | 4/2014 | Aiura |
| 2016/0043710 A1 | 2/2016 | Crandall et al. |
| 2016/0380632 A1 | 12/2016 | Crandall et al. |
| 2017/0126215 A1* | 5/2017 | Crandall ............... H01L 23/66 |
| 2017/0126226 A1* | 5/2017 | Englekirk ........ H03K 19/01850 |
| 2017/0201250 A1* | 7/2017 | Heaney ............... H01L 27/1203 |

FOREIGN PATENT DOCUMENTS

| | | |
|---|---|---|
| JP | 2008-236961 A | 10/2008 |
| JP | 2011-071791 A | 4/2011 |
| JP | 2013-131979 A | 7/2013 |
| JP | 2014-082744 A | 5/2014 |
| JP | 2015-056781 A | 3/2015 |
| WO | 2016/023007 A1 | 2/2016 |

OTHER PUBLICATIONS

Written Opinion for International Application No. PCT/JP2018/023605 dated Aug. 14, 2018.

* cited by examiner

VOLTAGE SUPPLY CIRCUIT AND RADIO-FREQUENCY CIRCUIT MODULE

This is a continuation of International Application No. PCT/JP2018/023605 filed on Jun. 21, 2018 which claims priority from Japanese Patent Application No. 2017-132397 filed on Jul. 6, 2017. The contents of these applications are incorporated herein by reference in their entireties.

BACKGROUND

Technical Field

The present disclosure relates to a voltage supply circuit including a charge pump and to a radio-frequency circuit module including the voltage supply circuit.

In an electronic device having a power supply voltage reduced to a very low level, for example, different power supply voltages are generally required for a logic circuit and a radio-frequency circuit. Under such circumstances, a charge pump and a level shifter are often used in a circuit section in which the radio-frequency circuit is controlled by an output signal of the logic circuit.

Patent Document 1 discloses a voltage-supplied circuit including a voltage regulator, a charge pump, and a level shifter to supply a bias voltage to an RF switch.

Patent Document 1: U.S. Unexamined Patent Application Publication No. 2016/0380632

BRIEF SUMMARY

When the above-described type of voltage supply circuit is used in an electronic device with low power consumption, stopping operations of the voltage regulator and the charge pump is effective in reducing power consumption of the voltage supply circuit in a state in which a radio-frequency module is substantially not used (i.e., in an off-state). However, when the voltage regulator and the charge pump having been once stopped are controlled to start the operations again at the time of applying a bias voltage to the RF switch, responsivity in rise of an output voltage of the charge pump is poor. Accordingly, the RF switch cannot be operated for switching at high speed. Stated in another way, it is difficult to balance reduction in the power consumption of the voltage supply circuit and responsivity of a voltage-supplied circuit.

The present disclosure provides a voltage supply circuit including a charge pump in which power consumption is reduced and responsivity is increased at the starting of voltage supply to a voltage-supplied circuit that is to be supplied with a voltage from the voltage supply circuit. The present disclosure further provides a radio-frequency circuit module including the voltage supply circuit.

(1) The present disclosure provides a voltage supply circuit configured to control a supply of a predetermined voltage to a voltage-supplied circuit, the voltage supply circuit. The voltage supply circuit includes a level shifter that is configured to selectively output one of at least two voltage inputs, and a charge pump circuit that is configured to transform a voltage of an input power supply and to apply the transformed voltage to the level shifter as one of the at least two voltage inputs. The voltage supply circuit further includes a charge pump control circuit that is configured to cause the charge pump circuit to perform a continuous operation when the voltage supply circuit operates in an on-mode and to perform an intermittent operation when the voltage supply circuit operates in an off-mode. The prede-termined voltage is not supplied to the voltage-supplied circuit when the voltage supply circuit operates in the off-mode. The predetermined voltage is supplied to the voltage-supplied circuit when the voltage supply circuit operates in the on-mode.

With the above features, in the off-mode, since the charge pump performs the intermittent operation, power consumption of the charge pump is reduced. On the other hand, since an output voltage of the charge pump is always held at a certain voltage, a time taken, after switching from the off-mode to the on-mode, until start of supply of the required voltage to the voltage-supplied circuit is shortened.

(2) In (1), the charge pump control circuit can be configured to detect an output voltage of the charge pump circuit and causes the charge pump circuit to perform the intermittent operation in response to sensing that the output voltage of the charge pump circuit reaches a threshold. With that feature, the intermittent operation of the charge pump can be performed by a simple circuit.

(3) In (2), for example, the transformed voltage is a negative voltage, and the charge pump control circuit comprises a first MOS-FET connected between the input power supply and an output of the charge pump circuit, and a diode connected to a gate of the first MOS-FET and connected between the output of the charge pump circuit and ground, wherein the threshold is a forward voltage drop produced by the first diode.

The above features can eliminate a leak (discharge) that may occur, for example, when a resistive voltage divider circuit is disposed, and can further reduce the power consumption.

(4) In (2), for example, the transformed voltage is a negative voltage, the charge pump control circuit comprises a resistive voltage divider circuit that is configured to divide a voltage difference between the output voltage of the charge pump circuit and the voltage of the input power supply, and wherein the threshold is an output voltage of the resistive voltage divider circuit.

(5) In (2), for example, transformed voltage is a positive voltage, and the charge pump control circuit comprises a first MOS-FET connected between the input power supply and an output of the charge pump circuit, and a diode connected to a gate of the first MOS-FET and connected between the output of the charge pump and ground, the threshold is a voltage drop produced by the first diode.

The above features can eliminate the leak (discharge) that may occur, for example, when the resistive voltage divider circuit is disposed, and can further reduce the power consumption.

(6) In (2), for example, the transformed voltage is a positive voltage, the charge pump control circuit comprises a resistive voltage divider circuit configured to divide a voltage difference between the output voltage of the charge pump circuit and a ground potential, and the threshold is an output voltage of the resistive voltage divider circuit.

(7) In (3), the charge pump control circuit can further comprise a second MOS-FET, the diode includes a plurality of diodes, and the second MOS-FET is connected in parallel to at least one among the plurality of diodes. With those features, a period of the intermittent operation can be set longer, and the power consumption can be further reduced.

(8) In (5), the charge pump control circuit can further include a second MOS-FET, the diode includes a plurality of diodes, and the second MOS-FET is connected in parallel to at least one among the plurality of diodes. With those features, the period of the intermittent operation can be set longer, and the power consumption can be further reduced.

(9) In (4) or (6), the charge pump control circuit can further comprise a hysteresis comparator connected between the input power supply and ground, and a reference voltage supply circuit connected to the hysteresis comparator and configured to output a reference voltage, and that the hysteresis comparator configured to compare the output voltage of the resistive voltage divider circuit and the reference voltage. With those features, the period of the intermittent operation can be set longer, and the power consumption can be further reduced.

(10) In (7) or (8), the plurality of diodes can comprise a diode-connected MOS-FET, and a gate of the diode-connected MOS-FET can be connected to the gate of the first MOS-FET. Those features suppress variations of electrical characteristics, which are caused by variations in the manufacturing process of a semiconductor integrated circuit.

(11) In any one of (1) to (10), for example, the charge pump circuit comprises an enable terminal, and the charge pump control circuit is configured to control the charge pump circuit in accordance with a signal output by the charge pump control circuit and supplied to the enable terminal of the charge pump circuit.

(12) In any one of (1) to (10), for example, the charge pump control circuit comprises a switch configured to selectively apply the voltage of the input power supply to the charge pump circuit, and to control an operation state of the charge pump circuit in accordance with a state of the switch.

(13) In any one of (1) to (12), for example, the charge pump circuit may be configured to apply at least two voltage inputs to the level shifter by transforming the voltage of the input power supply, With those features, a change width of the voltage supplied to the voltage-supplied circuit can be increased even when the voltage of the input power supply is low.

(14) The present disclosure further provides a radio-frequency circuit module including: an RF switch configured to selectively supply a radio-frequency signal in accordance with a control voltage, and a voltage supply circuit configured to supply the control voltage to the RF switch. The voltage supply circuit includes a level shifter that is configured to selectively output one of at least two voltage inputs, and a charge pump circuit that is configured to transform a voltage of an input power supply and to apply the transformed voltage to the level shifter as one of the at least two voltage inputs. The voltage supply circuit further includes a charge pump control circuit that is configured to cause the charge pump circuit to perform a continuous operation when the voltage supply circuit operates in an on-mode and to perform an intermittent operation when the voltage supply circuit operates in an off-mode. The predetermined voltage is not supplied to the voltage-supplied circuit when the voltage supply circuit operates in the off-mode. The predetermined voltage is supplied to the voltage-supplied circuit when the voltage supply circuit operates in the on-mode.

With the above features, the radio-frequency circuit module operating with a low power supply voltage and performing on/off control of the RF switch is obtained.

The radio-frequency circuit module may further include a first die, and the first die may include, for example, the charge pump circuit and the charge pump control circuit.

The first die may further include the level shifter and a regulator circuit that stabilizes the voltage of the input power supply. With that feature, the radio-frequency circuit module can be constituted with a smaller number of elements.

The first die may further include the RF switch. With that feature, the radio-frequency circuit module can be constituted with an even smaller number of elements.

The radio-frequency circuit module may include a second die and a substrate, the second die may include the RF switch, and the first die and the second die may be mounted on the substrate.

The second die may include a radio-frequency power amplifier connected to the RF switch, and the first die may further include the RF switch, a radio-frequency low-noise amplifier connected to the RF switch, and a voltage supply circuit for the radio-frequency low-noise amplifier. With that feature, the radio-frequency circuit module can be constituted with an even smaller number of elements.

The radio-frequency circuit module may further include a third die, the third die may include a radio-frequency power amplifier connected to the RF switch, and the third die may be mounted on the substrate.

According to the present disclosure, the power consumption of the voltage supply circuit including the charge pump circuit is reduced, and responsivity is increased at the starting of the voltage supply to the voltage-supplied circuit that is to be supplied with the voltage from the voltage supply circuit.

DETAILED DESCRIPTION

Figure 1:
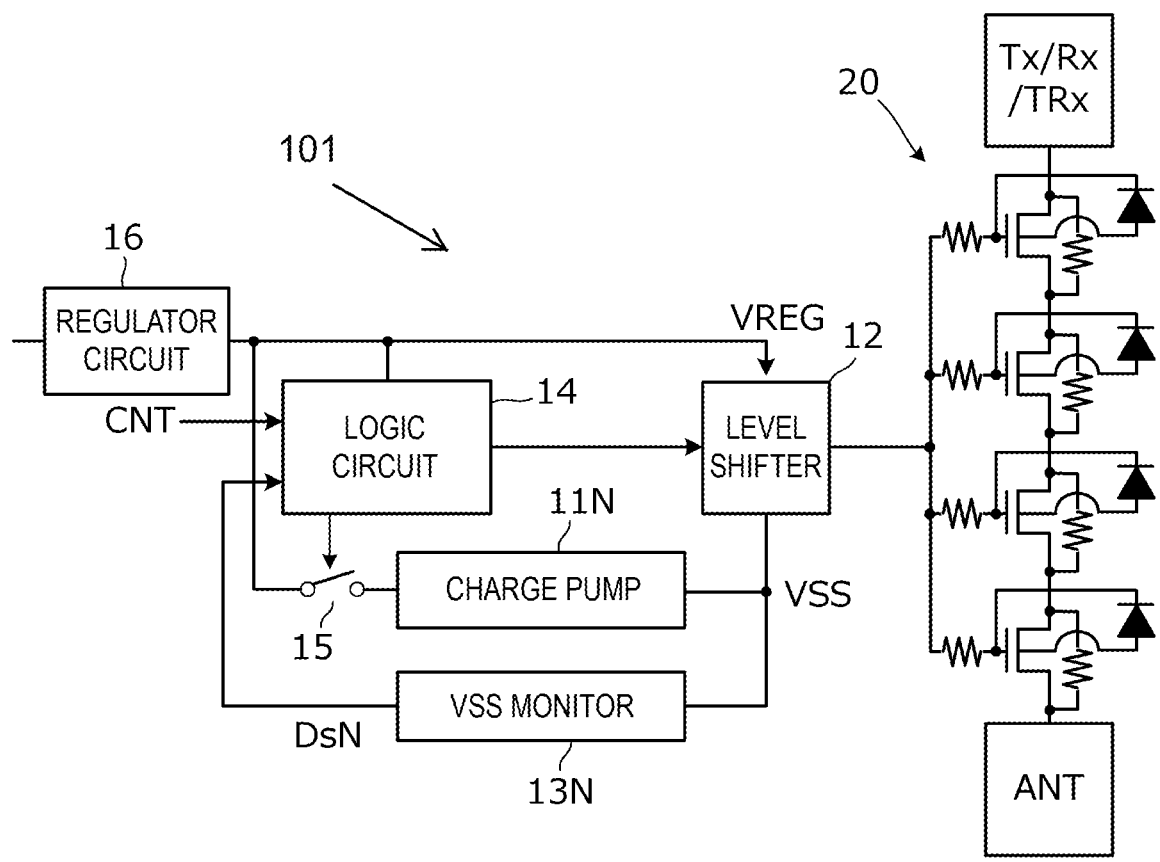
FIG. 1 is a block diagram illustrating a configuration of a radio-frequency circuit module 101 according to a first embodiment.

Embodiments for carrying out the present disclosure will be described below in connection with several practical examples by referring to the drawings. The same components in the drawings are denoted by the same reference signs. For convenience, the following description is made about different embodiments separated in consideration of easiness of explanation and understanding of the gist, but features of the different embodiments can be partially replaced or combined with each other. In second and subsequent embodiments, description of matters common to those in a first embodiment is omitted and only different points are described. In particular, similar advantageous effects obtained with similar features are not repeatedly explained in each of the embodiments.

First Embodiment

FIG. 1 is a block diagram illustrating a configuration of a radio-frequency circuit module 101 according to the first embodiment. The radio-frequency circuit module 101 includes a regulator circuit 16, a logic circuit 14, a charge pump 11N, and a level shifter 12. The regulator circuit 16 stabilizes a voltage of an input power supply and supplies the voltage to the charge pump 11N, the logic circuit 14, and the level shifter 12. The charge pump 11N transforms an output voltage of the regulator circuit 16, i.e., the voltage of the input power supply having been stabilized by the regulator circuit 16, and applies the transformed voltage to the level shifter 12. The level shifter 12 switches between the output voltage of the regulator circuit 16 and the output voltage of the charge pump 11N and outputs one of the output voltages to an RF switch 20. The RF switch 20 corresponds to a "voltage-supplied circuit" according to the present disclosure. The charge pump 11N is an example of a "charge pump circuit", so in the radio-frequency circuit module 101, the "charge pump circuit" is configured to apply one voltage input to the level shifter 12.

The logic circuit 14 indicates, as an "off-mode", a state in which the voltage supply, which is a supply of a predetermined voltage, to the RF switch 20 is stopped and, as an "on-mode", a state in which the predetermined voltage is supplied. The logic circuit 14 causes the charge pump 11N to perform a continuous operation when a "voltage supply circuit," which is written later, operates in the on-mode, and to perform an intermittent operation when the "voltage supply circuit" operates in the off-mode.

The regulator circuit 16 outputs a positive output voltage VREG (for example, 2.3 V). The charge pump 11N outputs a negative output voltage VSS (for example, a voltage of higher than −3.0 V and not higher than −1.5 V).

The level shifter 12 outputs VREG or VSS to the RF switch 20 in accordance with a switching signal from the logic circuit 14.

A "voltage supply circuit" according to the present disclosure is constituted by the level shifter 12, the charge pump 11N, and the logic circuit 14.

The RF switch 20 includes multiple stages of MOS-FET circuits connected in series, each of the MOS-FET circuits is constituted by a MOS-FET, a resistance connected between a drain and a source of the MOS-FET, and a diode connected between a back gate and a gate of the MOS-FET.

A resistance for applying a gate signal is connected to the gate of each MOS-FET. The RF switch 20 is connected, for example, between a transmitter circuit Tx, a receiver circuit Rx, or a transceiver circuit TRx and an antenna ANT. Although FIG. 1 illustrates only one RF switch 20, the radio-frequency circuit module 101 may include the plurality of RF switches 20. In other words, the radio-frequency circuit module 101 may include a plurality of circuits such as two or more among the transmitter circuit Tx, the receiver circuit Rx, and the transceiver circuit TRx, and the plurality of the RF switches 20 each connected between each of those circuits and the antenna ANT. In that case, the radio-frequency circuit module 101 includes the plurality of level shifters 12 connected to the plurality of RF switches 20 in a one-to-one relation.

When the positive output voltage VREG is applied to the RF switch 20 from the level shifter 12, each diode is shut off and each MOS-FET is conducted, thus establishing continuity between the transmitter circuit Tx, the receiver circuit Rx, or the transceiver circuit TRx and the antenna ANT.

When the negative output voltage VSS is applied to the RF switch 20 from the level shifter 12, each diode is conducted and each MOS-FET is more reliably shut off, thus cutting off the continuity between the transmitter circuit Tx, the receiver circuit Rx, or the transceiver circuit TRx and the antenna ANT. Thus, the RF switch 20 is configured to selectively supply a radio frequency signal in accordance with a control voltage such as the negative output voltage VSS or the positive output voltage VREG.

A switch 15 is disposed between the regulator circuit 16 and an input portion of the charge pump 11N. When the switch 15 is in an on-state, the charge pump 11N is operated to receive the output voltage VREG from the regulator circuit 16 and outputs the output voltage VSS (negative voltage) as the transformed voltage. When the switch 15 is in an off-state, the charge pump 11N is stopped and outputs (discharges) a voltage charged in a capacitor in an output portion (i.e., a charged voltage). Therefore, when the switch 15 is in the off-state, the output voltage of the charge pump 11N gradually rises from −3.0 V, for example. The switch 15 selectively applies the voltage of the input power supply.

In FIG. 1, a VSS monitor 13N detects the output voltage VSS of the charge pump 11N and provides, to the logic circuit 14, a signal (detection signal DsN) indicating whether the detected output voltage VSS has reached a predetermined threshold. In this embodiment, a "charge pump control circuit," which controls an operation state of the chare pump circuit according to the present disclosure, is constituted by the VSS monitor 13N and the logic circuit 14.

The logic circuit 14 performs control in the on-mode or the off-mode in accordance with a control signal CNT given from the outside. Details are as follows.

[On-Mode]

The switch 15 is kept in the on-state regardless of the detection signal DsN, i.e., the output signal of the VSS monitor 13N. Accordingly, the charge pump 11N is continuously operated and continuously outputs −3.0 V, for example.

[Off-Mode]

First, the switch 15 is turned off. The charge pump 11N is thereby brought into a stopped state (non-operating state), and the output voltage VSS (negative voltage) of the charge pump 11N gradually rises. When the VSS monitor 13N senses that the output voltage VSS of the charge pump 11N has reached a predetermined threshold (for example, −1.5 V), the logic circuit 14 turns on the switch 15. Accordingly, the charge pump 11N is brought into an operating state and hence the output voltage VSS drops to a predetermined voltage (for example, −3.0 V) (conversely, the voltage in absolute value rises).

When the VSS monitor 13N senses that the output voltage VSS of the charge pump 11N has dropped beyond the predetermined threshold (for example, −3.0 V), the logic circuit 14 turns off the switch 15. Accordingly, the charge pump 11N is brought into the non-operating state and hence the output voltage VSS of the charge pump 11N gradually rises again.

Thus, the threshold in the off-mode may be defined as not only a threshold at which the charge pump 11N is operated (namely, the switch 15 is turned on), but also a threshold at which the charge pump 11N is stopped (namely, the switch 15 is turned off). In this connection, the threshold for starting the operation and the threshold for stopping the operation may be set to different values or to the same value.

The charge pump 11N is intermittently operated in accordance with the detection by the VSS monitor 13N and the turning-on/off of the switch 15. For example, the charge pump 11N can alternate between its non-operating state and its instant operating state, with a period of its non-operating state being longer than that of its operating state. In other examples of the intermittent operation, the period of the operating state may be longer than that of the non-operating state. The periods of each state may also be constant or variable during the intermittent operation. In other words, the charge pump 11N performs the intermittent operation in the off-mode.

Figure 2:
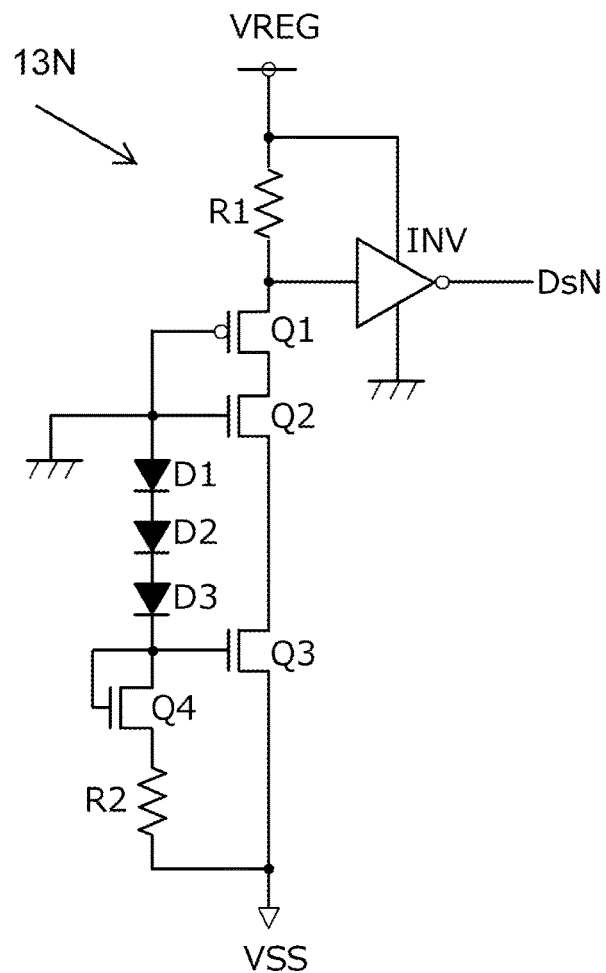
FIG. 2 illustrates an example of a circuit diagram of a VSS monitor 13N.

FIG. 2 illustrates an example of a circuit diagram of the VSS monitor 13N. The VSS monitor 13N includes a serial circuit connected between a line of the positive output voltage VREG, i.e., an input power supply line to which the voltage of the input power supply is applied, and a line of the negative output voltage VSS, the serial circuit being constituted by a resistance R1, a p-channel MOS-FET Q1, and n-channel MOS-FETs Q2 and Q3. The VSS monitor 13N further includes a serial circuit connected between ground (0 V) and a line of the output voltage VSS, the serial circuit being constituted by diodes D1, D2 and D3, an n-channel MOS-FET Q4, and a resistance R2. The diodes D1, D2 and D3, the FET Q4, and the resistance R2 are connected to gates of the FETs Q1, Q2, and Q3. The FETs Q1 and Q2 are examples of a "first MOS-FET" configuration. The diode D1, D2, and D3 are examples of a diode configuration. In FIG. 2, the diode configuration includes a plurality of diodes, but alternatively the diode configuration may include only one diode. In addition, the VSS monitor 13N includes an inverter INV connected to a junction between the resistance R1 and the p-channel MOS-FET Q1. The inverter INV inverts and outputs a logic potential at the junction between the resistance R1 and the p-channel MOS-FET Q1. An output signal of the inverter INV is the signal (detection signal DsN) that is given to the logic circuit 14 illustrated in FIG. 1.

The n-channel MOS-FET Q4 is an FET element having a drain and a gate connected to each other, and it acts as a diode. The gate of the MOS-FET Q4 is connected to the gate of the MOS-FET Q3. The MOS-FET Q4 having such a diode-connected structure suppresses variations of electrical characteristics, which are caused by variations in the manufacturing process of a semiconductor integrated circuit.

Operations of the circuit, illustrated in FIG. 2, in two states are as follows.

[State in which Output Voltage VSS is Lower than Predetermined Voltage]

Referring to FIG. 2, in a state in which the output voltage VSS is lower than the predetermined voltage (for example, −1.5 V) that is the threshold, the diodes D1, D2 and D3 and the FET Q4 are conducted, and a current flows in the serial circuit constituted by the diodes D1, D2 and D3, the FET Q4, and the resistance R2. Therefore, a gate-source voltage of the FET Q3 exceeds a threshold voltage of the FET Q3, and the FET Q3 is turned on. Furthermore, a gate-source voltage of the FET Q2 also exceeds its threshold voltage, and the FET Q2 is turned on. The FET Q1 is in an on-state because the positive voltage (VREG) is always applied as a gate-source voltage of the FET Q1. Accordingly, an input voltage of the inverter INV is at a "L (Low)" level, and the detection signal DsN takes a "H (High)" level. When the detection signal DsN at the "H" level is output to the logic circuit 14, the logic circuit 14 turns off the switch 15.

[State in which Output Voltage VSS is not Lower than Predetermined Voltage]

When the output voltage VSS rises and reaches the predetermined voltage, the diodes D1, D2 and D3 and the FET Q4 are shut off, and a current does not flow in the serial circuit constituted by the diodes D1, D2 and D3, the FET Q4, and the resistance R2. Therefore, the gate-source voltage of the FET Q3 does not reach the threshold voltage of the FET Q3, and the FET Q3 is turned off. Furthermore, the gate-source voltage of the FET Q2 also does not reach its threshold voltage, and the FET Q2 is turned off. Accordingly, the input voltage of the inverter INV is at a "H" level, and the detection signal DsN takes a "L" level. When the detection signal DsN at the "L" level is output to the logic circuit 14, the logic circuit 14 turns on the switch 15.

On that occasion, the serial circuit including the diodes D1, D2 and D3 and the FET Q4 acting as a diode is connected between the ground (0 V) and the line of the negative output voltage VSS of the charge pump 11N, and it controls passage and cutoff of a forward current flowing from a potential of 0 V toward a negative potential by using a voltage drop in a forward direction (i.e., a forward drop voltage).

In more detail, in the state in which the output voltage VSS is lower than the predetermined voltage (threshold), a voltage higher than the above-described forward drop voltage is applied to the above-described serial circuit, and the above-described serial circuit is conducted. On the other hand, in the state in which the output voltage VSS reaches the predetermined voltage (threshold), the voltage applied to the above-described serial circuit is lower than the forward drop voltage, and hence the above-described serial circuit is shut off. Thus, in the charge pump control circuit, illustrated in FIG. 2, including the VSS monitor 13N, the level of the detection signal DsN is switched by using the forward drop voltage in the serial circuit constituted by the diodes D1, D2 and D3 and the FET Q4 to define the threshold used in the detection by the VSS monitor 13N.

Although this embodiment represents the configuration including the plurality of diodes connected to the gate of the FET Q3 and connected between the ground and the line of the output voltage VSS, the number of the diodes connected to the gate of the FET Q3 and connected between the ground and the line of the output voltage VSS just needs to be one or more. In the case of using only one diode, the above-described threshold is given by the forward drop voltage in the serial circuit constituted by the one diode and the FET Q4. In the case of using two or more diodes, the above-described threshold is given by the forward drop voltage in the serial circuit constituted by those diodes and the FET Q4. Thus, the above-described threshold is given by the forward drop voltage in the serial circuit constituted by all the diodes connected to the gate of the FET Q3 and connected between the ground and the line of the output voltage VSS and the FET Q4.

Figure 3:
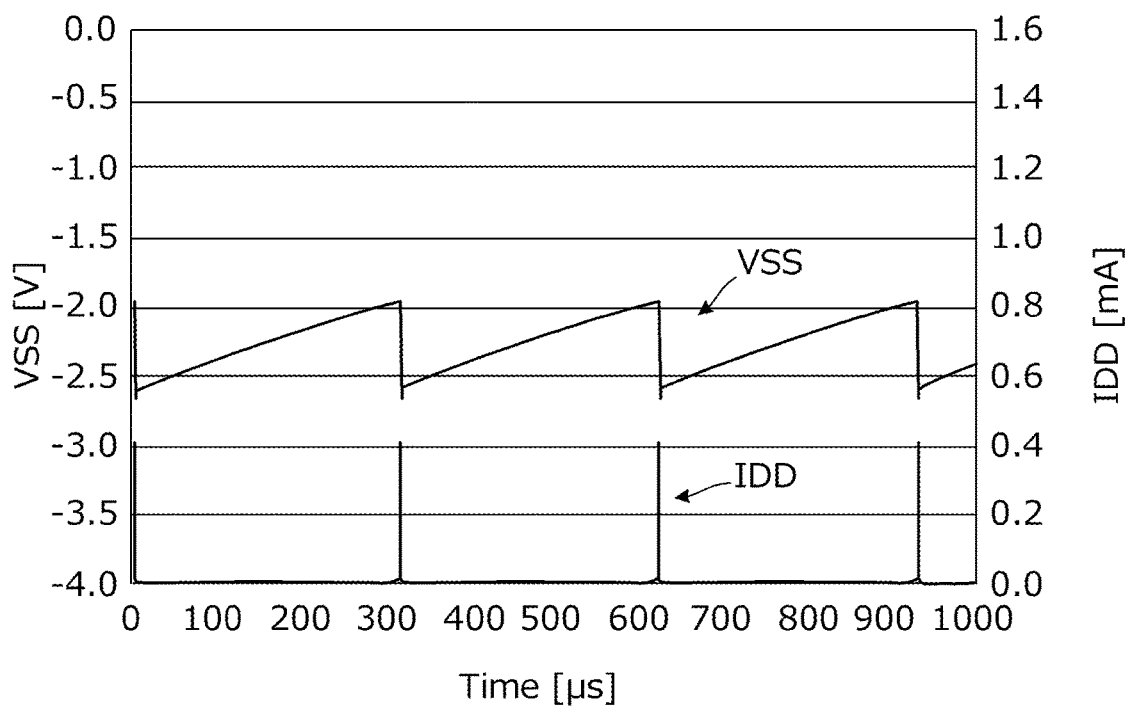
FIG. 3 is a waveform chart of an output voltage VSS and a consumed current IDD of a charge pump 11N in an off-mode.

FIG. 3 is a waveform chart of the output voltage VSS and a consumed current IDD of the charge pump 11N in the off-mode. FIG. 3 represents an example in which the predetermined threshold for use in detecting the output voltage VSS is set to −2.0 V. As described above, the off-mode is a mode in which the charge pump 11N performs the intermittent operation. In the intermittent operation, during a non-operating period of the charge pump 11N, VSS gradually rises with discharge from the capacitor in the output portion of the charge pump 11N. The start of the operation of the charge pump 11N causes an abrupt drop of VSS. For example, when VSS reaches −2.0 V, the charge pump 11N starts the operation. Hence VSS abruptly drops. When VSS is lower than −2.0 V, the charge pump 11N is brought into the non-operating state. In the illustrated example, the operation of the charge pump 11N is stopped after VSS has dropped to about −2.7 V. A period of the intermittent operation depends on responsivity in drop of the output voltage VSS (negative voltage) (i.e., rise of voltage in absolute value) at the start of the operation of the charge pump 11N. In the illustrated example, the charge pump 11N performs the intermittent operation with a period of about 300 µS.

The consumed current IDD of the charge pump 11N flows during the operation, but hardly flows during the non-operation. Therefore, the consumed current IDD flows in the form of an impulse as depicted in FIG. 3. A peak current of the consumed current IDD is about 0.4 mA while an average current is about 3 µA, namely very low.

Figure 4:
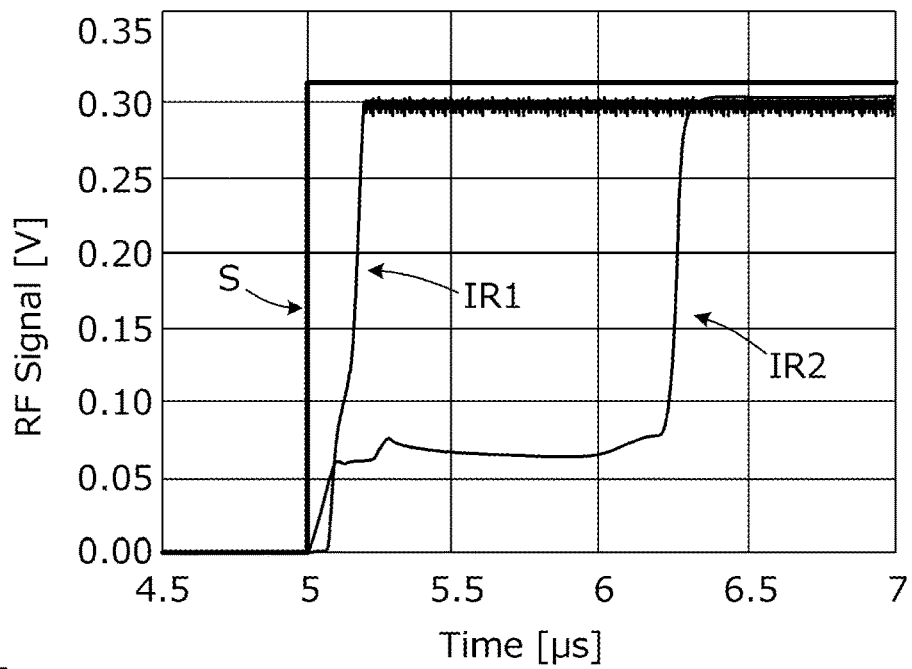
FIG. 4 is a chart illustrating responsivity of the radio-frequency circuit module 101 at the start of operation of the charge pump 11N.

FIG. 4 is a chart illustrating responsivity of the radio-frequency circuit module 101 at the start of the operation of the charge pump 11N. The responsivity illustrated in FIG. 4 represents responsivity obtained when, in the radio-frequency circuit module 101 equipped with the plurality of RF switches 20 including the RF switch 20 illustrated in FIG. 1, only the RF switch 20 illustrated in FIG. 1 is conducted and the other one or more not-illustrated RF switches 20 are shut off. In FIG. 4, a signal S indicates turn-on timing of the switch 15 in FIG. 1. A characteristic IR1 indicates rise characteristics of the radio-frequency circuit module 101 of this embodiment, and a characteristic IR2 indicates rise characteristics of a radio-frequency circuit module of a comparative example. The radio-frequency circuit module of the comparative example has such a configuration that the power supply voltage to the regulator circuit 16 and the charge pump 11N is interrupted in the off-mode and the power supply voltage is supplied to the regulator circuit 16 and the charge pump 11N in the on-mode.

A vertical axis in FIG. 4 represents a voltage of an RF signal output through the RF switch 20 illustrated in FIG. 1. In the illustrated example, the RF signal takes 0.3 V when the RF switch 20 is completely turned on.

Assuming that a startup time is defined as a time taken for the voltage of the RF signal to reach 90% of a specified value (0.3 V) from 50% of the signal S, as seen from FIG. 4, the startup time in the radio-frequency circuit module of the comparative example is 1.4 µS while the startup time in the radio-frequency circuit module 101 of this embodiment is 0.17 µs. Thus, a considerable time reduction (speedup) is obtained in the startup. In the radio-frequency circuit module of the comparative example, because the power supply voltage to the charge pump 11N is interrupted and the charge pump 11N is held in the non-operating state at all times in the off-mode, responsivity in rise of the output voltage of the charge pump 11N at switching to the on-mode is poor. Thus, turn-off responsivity of the other not-illustrated RF switches 20 is also poor, and the startup time is relatively prolonged with that poor turn-off responsivity affecting turn-on responsivity of the RF switch 20 illustrated in FIG. 1. On the other hand, in the radio-frequency circuit module 101 of this embodiment, since the charge pump 11N is intermittently operated in the off-mode, the responsivity in rise of the output voltage of the charge pump 11N at switching to the on-mode, i.e., the turn-off responsivity of the other not-illustrated RF switches 20, can be increased. Thus, the turn-on responsivity of the RF switch 20 illustrated in FIG. 1 can also be increased, and the startup time can be shortened.

Second Embodiment

A second embodiment represents the case of using a different example of the VSS monitor 13N from that used in the first embodiment.

Figure 5:
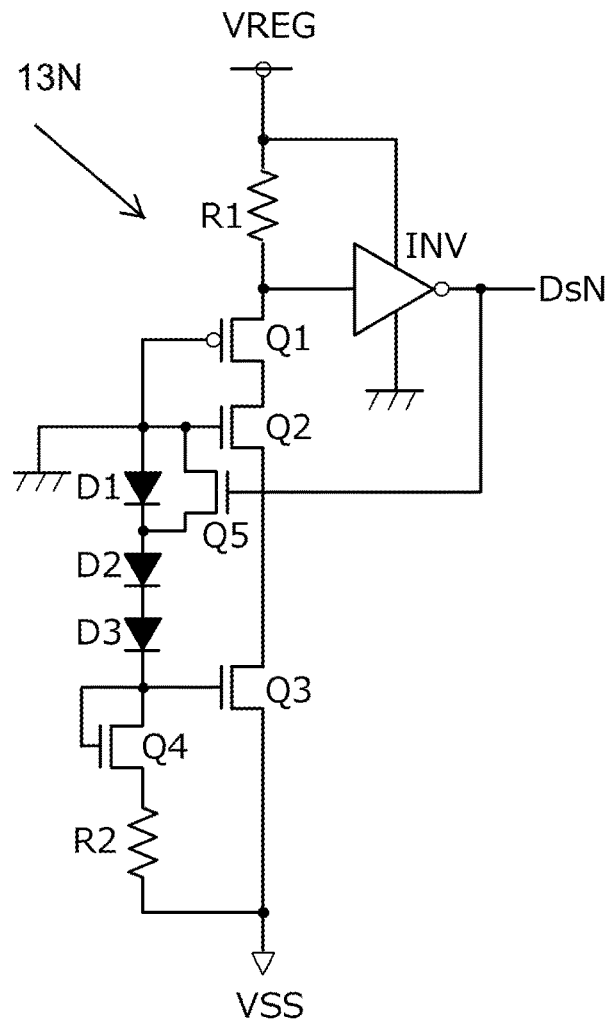
FIG. 5 is a circuit diagram of a VSS monitor 13N according to a second embodiment.

FIG. 5 is a circuit diagram of a VSS monitor 13N according to the second embodiment. This VSS monitor 13N is different from that illustrated in FIG. 2 in connecting an n-channel MOS-FET Q5 in parallel to the diode D1. The MOS-FET Q5 is an example of a "second MOSFET". The MOS-FET Q5 can be connected in parallel to the diode D2, diode D3, or a plurality of diodes among the diodes D1 to D3. The other points are the same.

In FIG. 5, because the detection signal DsN takes the "H" level when the output voltage VSS is lower than the predetermined voltage and takes the "L" level when the output voltage VSS is not lower than the predetermined voltage, the FET Q5 is turned on when the output voltage VSS is lower than the predetermined voltage and is turned off when the output voltage VSS is not lower than the predetermined voltage. Thus, when the output voltage VSS is lower than the predetermined voltage, the FET Q5 provides a path bypassing the diode D1, and the gate-source voltage of the FET Q3 is increased from that given when the FET Q3 is turned on. On the other hand, when the output voltage VSS is not lower than the predetermined voltage, the FET Q5 comes into an open state, and the gate-source voltage of the FET Q3 is decreased from that given when the FET Q3 is turned off.

As described above, since the above-described predetermined voltage (threshold) is changed depending on the result of detecting the state of the output voltage VSS, a hysteresis characteristic can be given to the detection of a level relation between the predetermined voltage and the output voltage VSS.

According to this embodiment, the period of the intermittent operation of the charge pump can be set longer, and the power consumption can be further reduced.

Third Embodiment

A third embodiment represents a radio-frequency circuit module different from that described in the first embodiment in a method of controlling the charge pump 11N to operate or stop.

Figure 6:
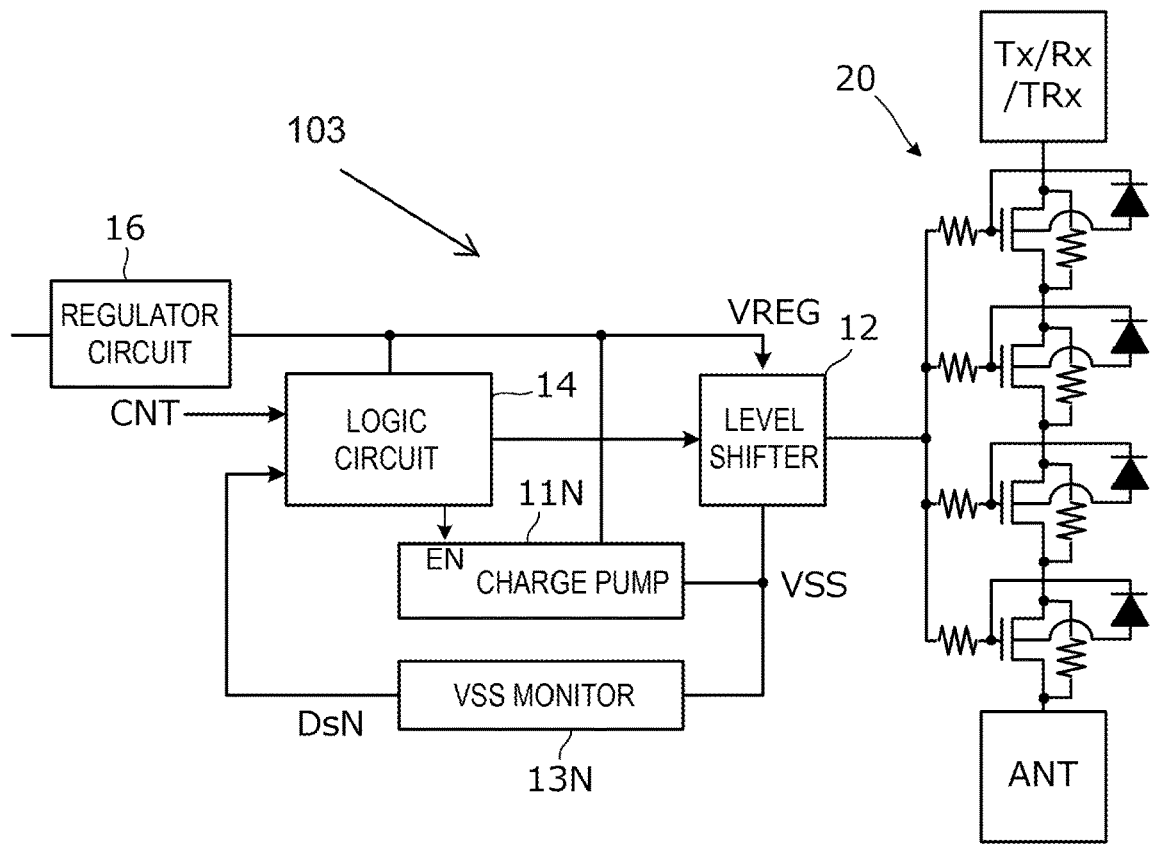
FIG. 6 is a block diagram illustrating a configuration of a radio-frequency circuit module 103 according to a third embodiment.

FIG. 6 is a block diagram illustrating a configuration of a radio-frequency circuit module 103 according to the third embodiment. This radio-frequency circuit module 103 includes a regulator circuit 16, a logic circuit 14, a charge pump 11N, a level shifter 12, and a VSS monitor 13N.

The radio-frequency circuit module 103 is different from that illustrated in FIG. 1 in configuration of the charge pump 11N and in control method for the charge pump 11N by the logic circuit 14. The charge pump 11N in this embodiment includes an enable terminal EN to switch between enabling and disabling an operation. The logic circuit 14 controls the charge pump 11N to operate or stop in accordance with a signal supplied to the enable terminal EN of the charge pump 11N.

The output voltage VREG is always applied to the charge pump 11N, and the charge pump 11N is operated or stopped in accordance with an input voltage to the enable terminal EN. For example, the charge pump 11N includes an oscillator therein. When the enable terminal EN is at a "H" level, the oscillator oscillates, whereby individual switches in a charge pump circuit are repeatedly turned on and off and the charge pump is operated. When the enable terminal EN is at a "L" level, the oscillator stops the oscillation, whereby the individual switches are held in constant states and the operation of the charge pump is stopped. In the operation stopped state of the charge pump 11N, power consumed by the charge pump is very small.

According to this embodiment, since there is no necessity of directly controlling a power supply line connected to the charge pump, a switch with a comparatively large current capacity and a driver circuit for the switch are not required.

Fourth Embodiment

A fourth embodiment represents a radio-frequency circuit module in which the charge pump is intermittently operated without necessarily using the VSS monitor.

Figure 7:
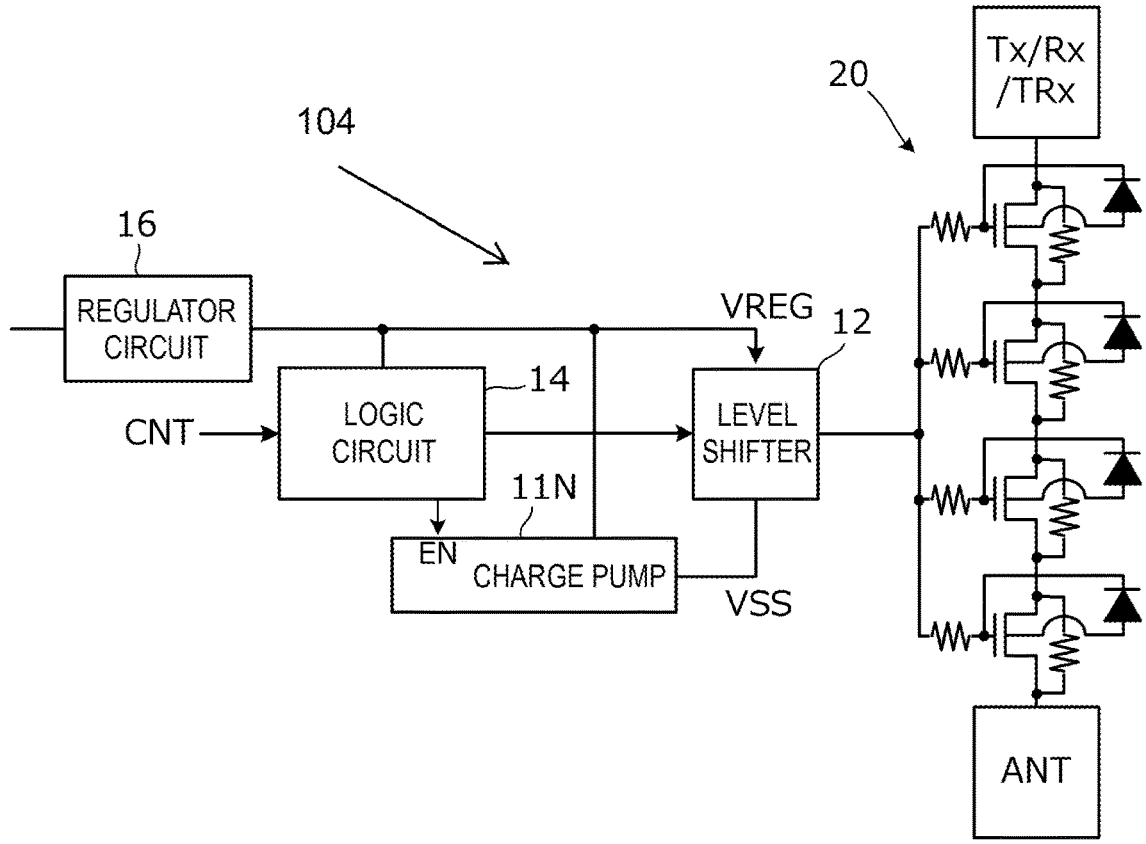
FIG. 7 is a block diagram illustrating a configuration of a radio-frequency circuit module 104 according to a fourth embodiment.

FIG. 7 is a block diagram illustrating a configuration of a radio-frequency circuit module 104 according to the fourth embodiment. This radio-frequency circuit module 104 includes a regulator circuit 16, a logic circuit 14, a charge pump 11N, and a level shifter 12.

In FIG. 7, the logic circuit 14 intermittently applies an effective signal to an enable terminal EN of the charge pump 11N in the off-mode. In other words, the logic circuit 14 causes the charge pump 11N to perform the intermittent operation. As a result, the output voltage VSS and the consumed current IDD of the charge pump 11N are changed as illustrated in FIG. 3, for example. In this embodiment, the "charge pump control circuit" in the present disclosure is constituted only by the logic circuit 14.

Although a counter with a comparatively large number of bits or a time constant circuit with a comparatively large time constant is required to obtain a longer period of the intermittent operation, the circuit can be simplified by this embodiment because the VSS monitor is not required.

Fifth Embodiment

A fifth embodiment represents an example of a radio-frequency circuit module charging up not only a negative voltage, but also a positive voltage.

Figure 8:
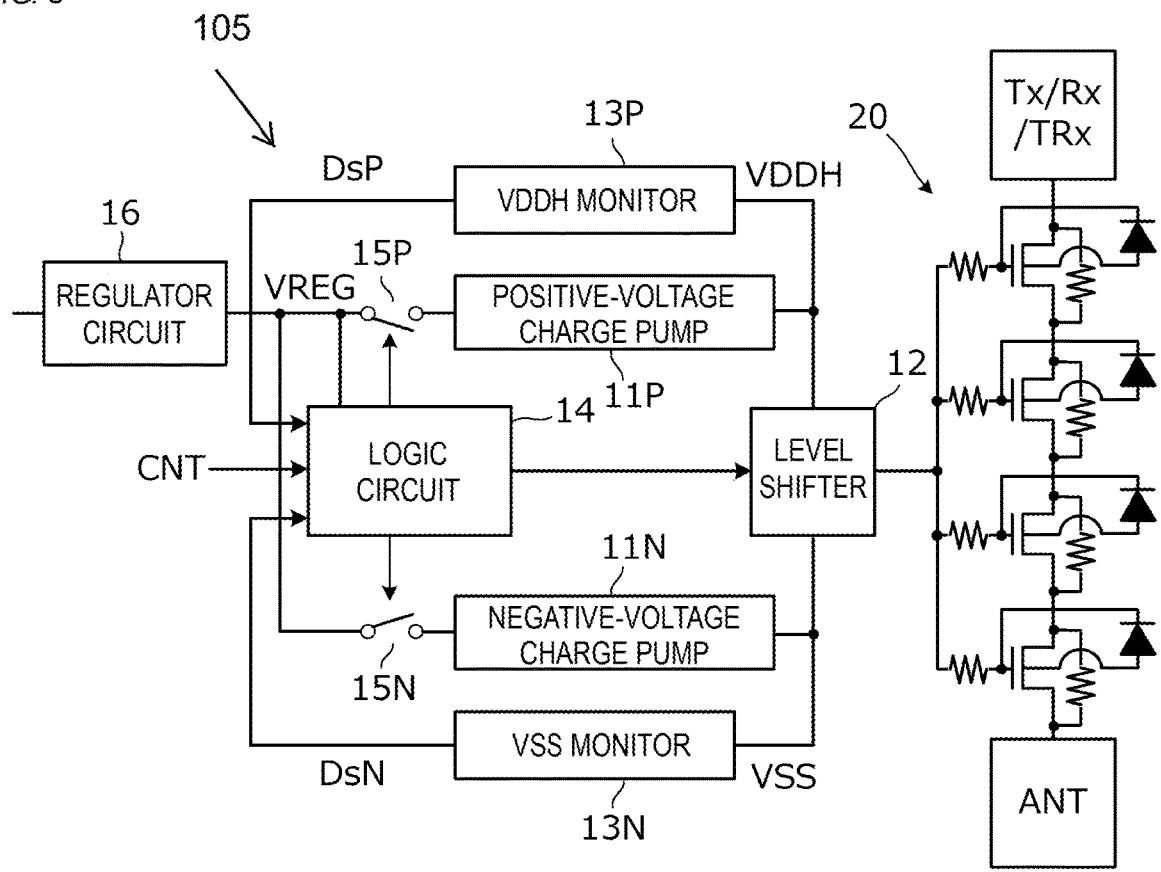
FIG. 8 is a block diagram illustrating a configuration of a radio-frequency circuit module 105 according to a fifth embodiment.

FIG. 8 is a block diagram illustrating a configuration of a radio-frequency circuit module 105 according to the fifth embodiment. This radio-frequency circuit module 105 includes a regulator circuit 16, a logic circuit 14, a negative-voltage charge pump 11N, a positive-voltage charge pump 11P, a level shifter 12, a VSS monitor 13N, a VDDH monitor 13P, switches 15N and 15P, etc. The radio-frequency circuit module 105 is different from that illustrated in FIG. 1 in including the positive-voltage charge pump 11P and the VDDH monitor 13P. In other words, the radio-frequency circuit module 105 is different from that illustrated in FIG. 1 in including a plurality of chare pumps 11N and 11P as a "charge pump circuit". Thus, in FIG. 8, the "charge pump circuit" is configured to apply two voltage inputs to the level shifter 12. The "chare pump circuit" may be configured to apply three or more voltage inputs to the level shifter 12.

The level shifter 12 outputs an output voltage VDDH (positive voltage) or an output voltage VSS (negative voltage) to the RF switch 20 in accordance with a switching signal from the logic circuit 14.

The "voltage supply circuit" in the present disclosure is constituted only by the level shifter 12, the charge pumps 11N and 11P, and the logic circuit 14.

In FIG. 8, the VSS monitor 13N detects the output voltage VSS (negative voltage) of the negative-voltage charge pump 11N and applies, to the logic circuit 14, a signal (detection signal DsN) indicating whether the output voltage VSS has reached a predetermined threshold. The VDDH monitor 13P detects the output voltage VDDH (positive voltage) of the positive-voltage charge pump 11P and applies, to the logic circuit 14, a signal (detection signal DsP) indicating whether the output voltage VDDH has reached a predetermined threshold.

The "charge pump control circuit" in the present disclosure is constituted only by the VSS monitor 13N, the VDDH monitor 13P, and the logic circuit 14.

The logic circuit 14 performs control in the above-described on-mode or off-mode in accordance with a control signal CNT given from the outside. Details are as follows.

[On-Mode]

The switches 15N and 15P are kept in an on-state regardless of the detection signal DsN, i.e., the output signal of the VSS monitor 13N, and of the detection signal DsP, i.e., the output signal of the VDDH monitor 13P. Accordingly, the negative-voltage charge pump 11N is continuously operated and continuously outputs −3.0 V, for example. The positive-voltage charge pump 11P is also continuously operated and continuously outputs +3.0 V, for example.

[Off-Mode]

First, the logic circuit 14 turns off the switch 15N. The negative-voltage charge pump 11N is thereby brought into a stopped state (non-operating state), and the output voltage VSS (negative voltage) of the negative-voltage charge pump 11N gradually rises. When the VSS monitor 13N senses that the output voltage VSS of the negative-voltage charge pump 11N has reached a predetermined threshold (for example, −1.5 V), the logic circuit 14 turns on the switch 15N. Accordingly, the negative-voltage charge pump 11N is brought into an operating state and hence the output voltage VSS drops to a predetermined voltage (for example, −3.0 V) (conversely, the voltage in absolute value rises).

When the VSS monitor 13N senses that the output voltage VSS of the negative-voltage charge pump 11N has dropped beyond the predetermined threshold (for example, −3.0 V), the logic circuit 14 turns off the switch 15N. Accordingly, the negative-voltage charge pump 11N is brought into the non-operating state and hence the output voltage VSS of the negative-voltage charge pump 11N gradually rises again.

Thus, the negative-voltage charge pump 11N is intermittently operated in accordance with the detection by the VSS monitor 13N and the turning-on/off of the switch 15N. In other words, the negative-voltage charge pump 11N performs the intermittent operation in the off-mode.

Furthermore, at the switching from the on-mode to the off-mode, the logic circuit 14 first turns off the switch 15P, namely at the same time as turning off the switch 15N. The positive-voltage charge pump 11P is thereby brought into a stopped state (non-operating state), and the output voltage VDDH (positive voltage) of the positive-voltage charge pump 11P gradually drops. When the VDDH monitor 13P senses that the output voltage VDDH of the positive-voltage charge pump 11P has reached a predetermined threshold (for example, +1.5 V), the logic circuit 14 turns on the switch 15P. Accordingly, the positive-voltage charge pump 11P is brought into an operating state and hence the output voltage VDDH rises to a predetermined voltage (for example, +3.0 V).

Thus, the positive-voltage charge pump 11P is intermittently operated in accordance with the detection by the VDDH monitor 13P and the turning-on/off of the switch 15P. In other words, the positive-voltage charge pump 11P performs the intermittent operation in the off-mode.

Figure 9:
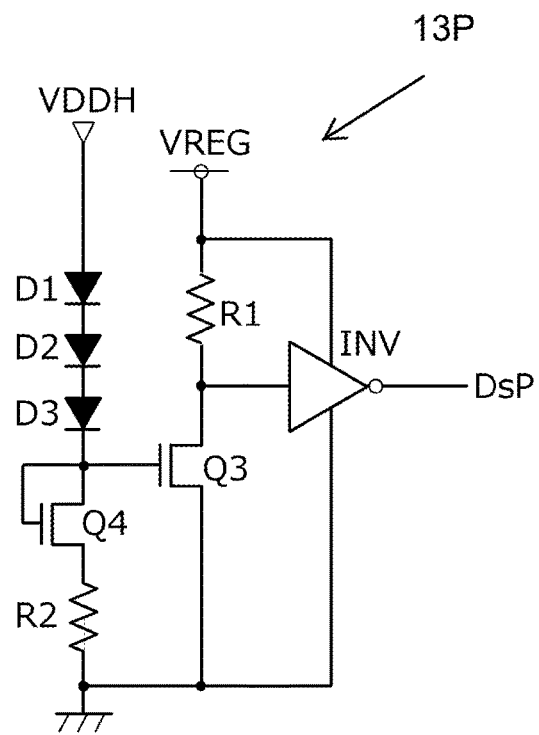
FIG. 9 is a circuit diagram of a VDDH monitor 13P according to the fifth embodiment.

FIG. 9 is a circuit diagram of the VDDH monitor 13P according to this embodiment. The VDDH monitor 13P includes a serial circuit connected between a line of the positive output voltage VDDH and a line of the voltage VREG of the input power supply, more specifically between the line of the voltage VREG of the input power supply and the ground (0 V), the serial circuit being constituted by a resistance R1 and an n-channel MOS-FET Q3. The VDDH monitor 13P further includes a serial circuit connected between the charged-up output voltage VDDH and the ground, the serial circuit being constituted by diodes D1, D2 and D3, an n-channel MOS-FET Q4, and a resistance R2. The serial circuit constituted by the diodes D1, D2 and D3, the FET Q4, and the resistance R2 are connected to a gate of the FET Q3. The MOS-FET Q3 is an example of a "first MOS-FET" and the diodes D1, D2, D3, and the FET Q4 are examples of a diode configuration. In FIG. 9, the diode includes a plurality of diodes, but alternatively the diode configuration may include only one diode. In addition, the VDDH monitor 13P includes an inverter INV connected to a junction between the resistance R1 and the re-channel MOS-FET Q3. The inverter INV inverts and outputs a logic potential at the junction between the resistance R1 and the n-channel MOS-FET Q3. An output signal of the inverter INV is the signal (detection signal DsP) that is given to the logic circuit 14 illustrated in FIG. 8.

The n-channel MOS-FET Q4 is an FET element having a drain and a gate connected to each other, and it acts as a diode. The MOS-FET Q4 having such a diode-connected structure suppresses variations of electrical characteristics, which are caused by variations in the manufacturing process of a semiconductor integrated circuit.

Operations of the circuit, illustrated in FIG. 9, in two states are as follows.

[State in which Output Voltage VDDH is Higher than Predetermined Voltage]

Referring to FIG. 9, in a state in which the charged-up output voltage VDDH is higher than the predetermined voltage (for example, 3.0 V) that is the threshold, the diodes D1, D2 and D3 and the FET Q4 are conducted, and a current flows in the serial circuit constituted by the diodes D1, D2 and D3, the FET Q4, and the resistance R2. Therefore, a gate-source voltage of the FET Q3 exceeds a threshold voltage of the FET Q3, and the FET Q3 is turned on. Accordingly, an input voltage of the inverter INV is at a "L" level, and the detection signal DsP takes a "H" level. When the detection signal DsP at the "H" level is output to the logic circuit 14, the logic circuit 14 turns off the switch 15P.

[State in which Output Voltage VDDH is not Higher than Predetermined Voltage]

When the charged-up output voltage VDDH drops and reaches the predetermined voltage, the diodes D1, D2 and D3 and the FET Q4 are shut off, and a current does not flow in the serial circuit constituted by the diodes D1, D2 and D3, the FET Q4, and the resistance R2. Therefore, the gate-source voltage of the FET Q3 does not reach the threshold voltage of the FET Q3, and the FET Q3 is turned off. Accordingly, the input voltage of the inverter INV is at a "H" level, and the detection signal DsP takes a "L" level. When the detection signal DsP at the "L" level is output to the logic circuit 14, the logic circuit 14 turns on the switch 15P.

On that occasion, the serial circuit including the diodes D1, D2 and D3 and the FET Q4 acting as a diode is connected between the ground (0 V) and the line of the positive output voltage VDDH of the positive-voltage charge pump 11P, and it controls passage and cutoff of a forward current flowing from a positive potential toward a potential of 0 V by using a forward voltage drop.

In more detail, in the state in which the output voltage VDDH is higher than the predetermined voltage (threshold), a voltage higher than the above-described forward drop voltage is applied to the above-described serial circuit, and the above-described serial circuit is conducted. On the other hand, in the state in which the output voltage VDDH reaches the predetermined voltage (threshold), the voltage applied to the above-described serial circuit is lower than the forward drop voltage, and hence the above-described serial circuit is shut off. Thus, in the charge pump control circuit, illustrated in FIG. 9, including the VDDH monitor 13P, the level of the detection signal DsP is switched by using the forward voltage drop in the serial circuit constituted by the diodes D1, D2 and D3 and the FET Q4 to define the threshold used in the detection by the VDDH monitor 13P.

Although this embodiment represents the configuration including the plurality of diodes connected to the gate of the FET Q3 and connected between the ground and the line of the output voltage VDDH, the number of the diodes connected to the gate of the FET Q3 and connected between the ground and the line of the output voltage VDDH just need to be one or more. In the case of using only one diode, the above-described threshold is given by the forward drop voltage in the serial circuit constituted by the one diode and the FET Q4. In the case of using two or more diodes, the above-described threshold is given by the forward drop voltage in the serial circuit constituted by those diodes and the FET Q4. Thus, the above-described threshold is given by the forward drop voltage in the serial circuit constituted by all the diodes connected to the gate of the FET Q3 and connected between the ground and the line of the output voltage VDDH and the FET Q4.

Figure 10:
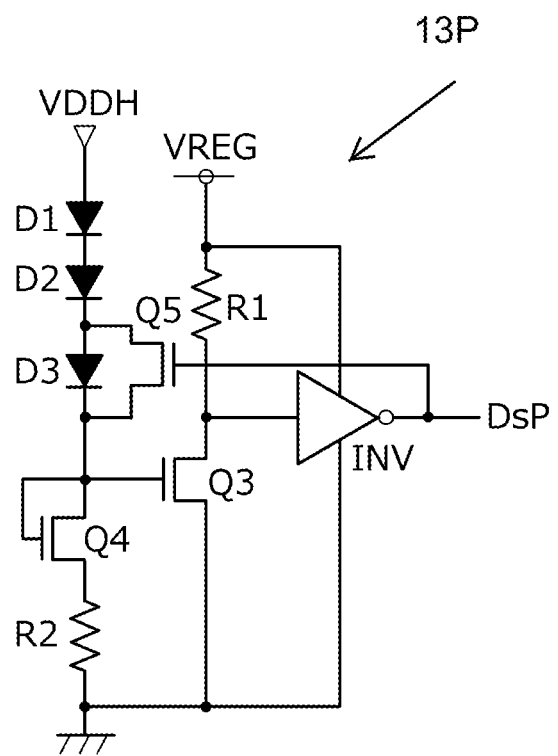
FIG. 10 is a circuit diagram of another VDDH monitor 13P according to the fifth embodiment.

FIG. 10 is a circuit diagram of another example of the VDDH monitor 13P according to this embodiment. This VDDH monitor 13P is different from that illustrated in FIG. 9 in connecting an re-channel MOS-FET Q5 in parallel to the diode D3. The other points are the same.

In FIG. 10, because the detection signal DsP takes the "H" level when the output voltage VDDH is higher than the predetermined voltage and takes the "L" level when the output voltage VDDH is not higher than the predetermined voltage, the FET Q5 is turned on when the output voltage VDDH is higher than the predetermined voltage and is turned off when the output voltage VDDH is not higher than the predetermined voltage. Thus, when the output voltage VDDH is higher than the predetermined voltage, the FET Q5 provides a path bypassing the diode D3, and the gate-source voltage of the FET Q3 is increased from that given when the FET Q3 is turned on. On the other hand, when the output voltage VDDH is not higher than the predetermined voltage, the FET Q5 comes into an open state, and the gate-source voltage of the FET Q3 is decreased from that given when the FET Q3 is turned off.

As described above, since the above-described predetermined voltage (threshold) is changed depending on the result of detecting the state of the output voltage VDDH, a hysteresis characteristic can be given to the detection of a level relation between the predetermined voltage and the output voltage VDDH. The diode to which the FET Q5 is connected in parallel is not limited to the diode D3, the FET Q5 may be connected to the diode D1 or D2.

Sixth Embodiment

A sixth embodiment represents an example of a charge-pump output voltage detection circuit using a hysteresis comparator.

Figure 11:
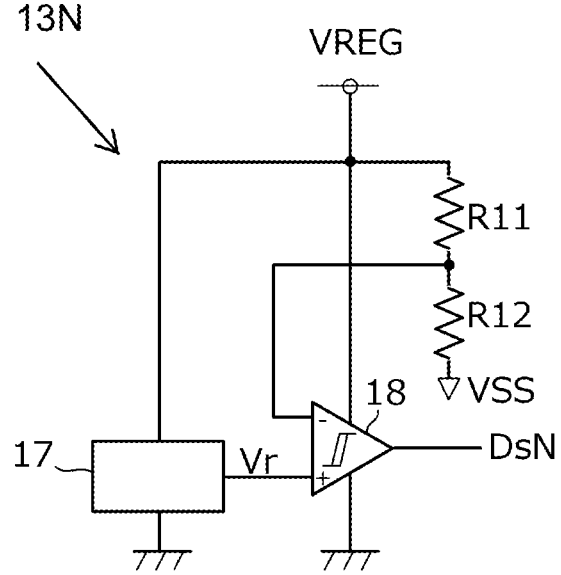
FIG. 11 is a circuit diagram of a VSS monitor 13N according to a sixth embodiment.

FIG. 11 is a circuit diagram of a VSS monitor 13N according to the sixth embodiment. A configuration of a radio-frequency circuit module to which this VSS monitor 13N is applied is the same as that illustrated in FIG. 1 or 8. The VSS monitor 13N includes a hysteresis comparator 18, a reference voltage generation circuit 17, and a resistive voltage divider circuit constituted by resistances R11 and R12. The resistive voltage divider circuit is a circuit for dividing a potential difference between the output voltage VSS of the negative-voltage charge pump 11N and the voltage VREG of the input power supply, and is constituted by the resistances R11 and R12 that are connected in series between a line to which the voltage of the input power supply is applied and a line to which the output voltage VSS is applied. The hysteresis comparator 18 compares an output voltage of the resistive voltage divider circuit and a reference voltage Vr.

Operations of the circuit, illustrated in FIG. 11, in two states are as follows.

[State in which Output Voltage VSS is Lower than Predetermined Voltage]

Referring to FIG. 11, in a state in which the output voltage VSS is lower than a predetermined voltage (for example, −1.5 V), the output voltage of the resistive voltage divider circuit is decreased from the reference voltage Vr by a value corresponding to a hysteresis width, and an output (detection signal DsN) of the hysteresis comparator 18 takes a "H" level.

[State in which Output Voltage VSS is not Lower than Predetermined Voltage]

Referring to FIG. 11, when the output voltage VSS rises and reaches the predetermined voltage, the output voltage of the resistive voltage divider circuit is increased from the reference voltage Vr by the value corresponding to the hysteresis width, and the output (detection signal DsN) of the hysteresis comparator 18 takes a "L" level.

Figure 12:
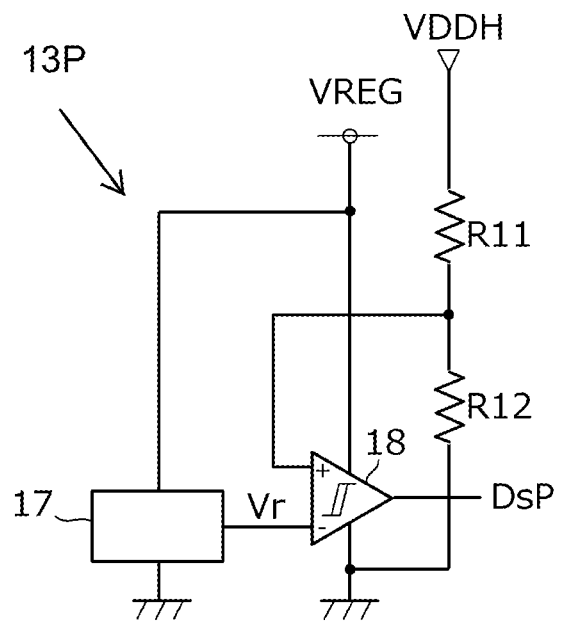
FIG. 12 is a circuit diagram of a VDDH monitor 13P according to the sixth embodiment.

FIG. 12 is a circuit diagram of a VDDH monitor 13P according to the sixth embodiment. A configuration of a radio-frequency circuit module to which this VDDH monitor 13P is applied is the same as that illustrated in FIG. 8. The VDDH monitor 13P includes a hysteresis comparator 18, a reference voltage generation circuit 17, and a resistive voltage divider circuit constituted by resistances R11 and R12. The resistive voltage divider circuit is a circuit for dividing a potential difference between the output voltage VDDH of the positive-voltage charge pump 11P and the ground potential, and is constituted by the resistances R11 and R12 that are connected in series between the ground and a line to which the output voltage VDDH is applied. The hysteresis comparator 18 compares an output voltage of the resistive voltage divider circuit and a reference voltage Vr.

Operations of the circuit, illustrated in FIG. 12, in two states are as follows.

[State in which Output Voltage VDDH is Higher than Predetermined Voltage]

Referring to FIG. 12, in a state in which the output voltage VDDH is higher than a predetermined voltage (for example, 1.5 V), the output voltage of the resistive voltage divider circuit is increased from the reference voltage Vr by a value corresponding to a hysteresis width, and an output (detection signal DsP) of the hysteresis comparator 18 takes a "H" level.

[State in which Output Voltage VDDH is not Higher than Predetermined Voltage]

Referring to FIG. 12, when the output voltage VDDH drops and reaches the predetermined voltage, the output voltage of the resistive voltage divider circuit is decreased from the reference voltage Vr by the value corresponding to the hysteresis width, and the output (detection signal DsP) of the hysteresis comparator 18 takes a "L" level.

As discussed in this embodiment, the charge-pump output voltage detection circuit may be designed to input, to a comparator, a voltage obtained by dividing a to-be-detected voltage with a resistive voltage divider circuit. With such a configuration, the circuit can be simplified even though there is a disadvantage that charges of the capacitor in the output portion of the charge pump are leaked (discharged) through the resistive voltage divider circuit when the charge pump is stopped.

According to this embodiment, since the comparator has the hysteresis characteristic, the period of the intermittent operation of the charge pump can be set longer, and the power consumption is further reduced.

Seventh Embodiment

A seventh embodiment represents an example of a packaged radio-frequency circuit module.

Figure 13A:
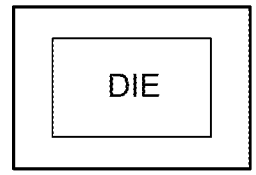
FIG. 13A is a plan view illustrating a package internal structure of a radio-frequency circuit module 107A according to a seventh embodiment.

FIG. 13A is a plan view illustrating a package internal structure of a radio-frequency circuit module 107A according to the seventh embodiment. A die in FIG. 13A is a semiconductor chip, and the entire circuit of the radio-frequency circuit module 101 illustrated in FIG. 1 is constituted on the die.

Figure 13B:
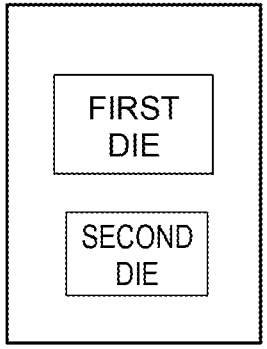
FIG. 13B is a plan view illustrating a package internal structure of another radio-frequency circuit module 107B according to the seventh embodiment.

FIG. 13B is a plan view illustrating a package internal structure of another radio-frequency circuit module 107B according to the seventh embodiment. A first die and a second die in FIG. 13B are each a semiconductor chip, and the first and second dies are mounted on a substrate. The charge pump 11N, the logic circuit 14, and the VSS monitor 13N of the radio-frequency circuit module 101 illustrated in FIG. 1 are constituted on the first die. The RF switch is constituted on the second die.

Figure 14:
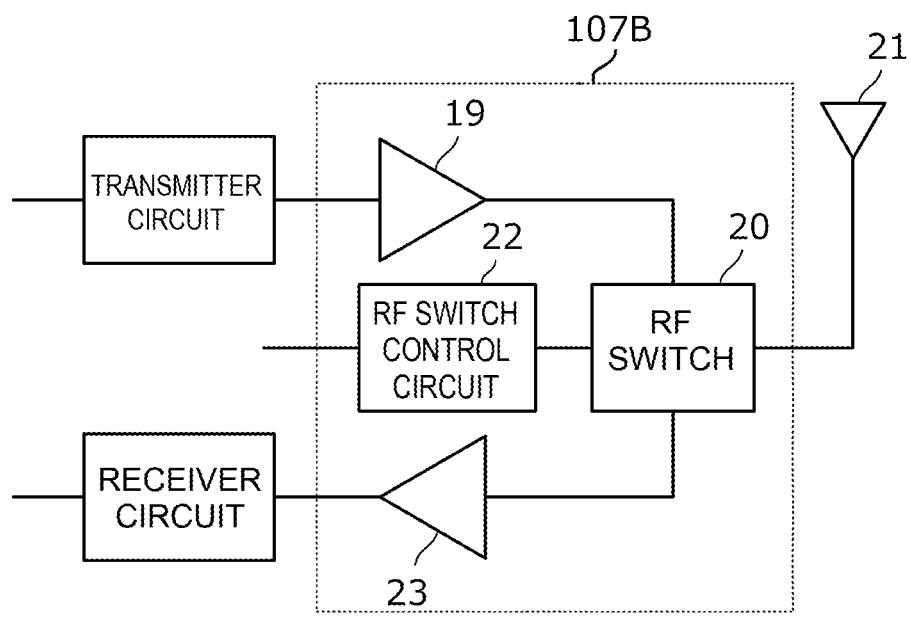
FIG. 14 is a block diagram of a radio-frequency circuit including the radio-frequency circuit module 107B according to the seventh embodiment.

FIG. 14 is a block diagram of a radio-frequency circuit including the radio-frequency circuit module 107B according to this embodiment. The radio-frequency circuit module 107B includes a radio-frequency power amplifier 19 that amplifies power of a transmit signal output from a transmitter circuit, an RF switch 20 switching between the transmit signal and a receive signal, an RF switch control circuit 22 controlling the RF switch, and a radio-frequency low-noise amplifier (LNA) 23. The RF switch 20 outputs, to an antenna 21, the transmit signal output from the radio-frequency power amplifier 19 and further outputs, to the radio-frequency low-noise amplifier 23, the receive signal input from the antenna 21. The radio-frequency low-noise amplifier 23 outputs the amplified receive signal to a receiver circuit. The RF switch control circuit 22 represents, for example, a section of the radio-frequency circuit module 101 illustrated in FIG. 1 except for the RF switch 20.

The first die may further include the level shifter 12, the switch 15, and the regulator circuit 16 illustrated in FIG. 1.

Alternatively, the radio-frequency power amplifier 19 connected to the RF switch 20 may be constituted on the second die, whereas the RF switch 20, the radio-frequency low-noise amplifier (LNA) 23 connected to the RF switch 20, and a power supply circuit for LNA may be constituted on the first die.

The radio-frequency low-noise amplifier (LNA) 23 is supplied with a voltage from the voltage supply circuit for LNA. The voltage supply circuit for LNA may include an LNA bias circuit and may further include a regulator. A logic circuit for controlling the voltage supply circuit for LNA is common to the logic circuit in the voltage supply circuit for the RF switch.

Eighth Embodiment

An eighth embodiment represents an example of a packaged radio-frequency circuit module having a different configuration from that in the seventh embodiment.

Figure 15:
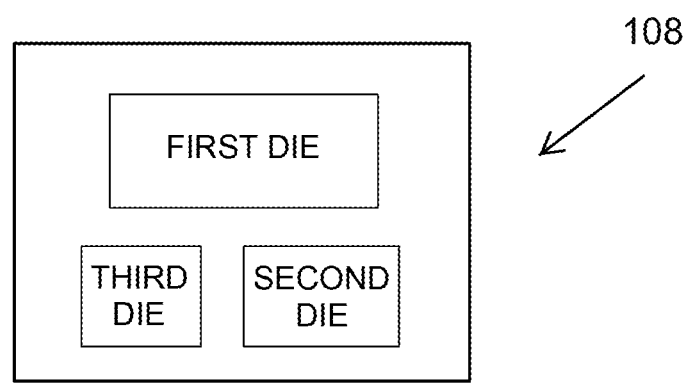
FIG. 15 is a plan view illustrating a package internal structure of a radio-frequency circuit module 108 according to an eighth embodiment.

FIG. 15 is a plan view illustrating a package internal structure of a radio-frequency circuit module 108 according to the eighth embodiment. A first die, a second die, and a third die in FIG. 15 are each a semiconductor chip. The first die, the second die, and the third die are mounted on a substrate. The first die and the second die have the same configurations as those described in the seventh embodiment. The radio-frequency power amplifier 19 illustrated in FIG. 14 is constituted on the third die.

Finally, the description of the above embodiments is intended to be illustrative in all respects, and not restrictive. The present disclosure can be optionally modified and altered by those skilled in the art. The scope of the present disclosure is defined in Claims, but not in the above embodiments. Modifications of the embodiments within the scope of Claims and within the range of equivalents also fall within the scope of the present disclosure.

REFERENCE SIGNS LIST

D1, D2, D3 . . . diode
EN . . . enable terminal
INV . . . inverter
R1, R2 . . . resistance
R11, R12 . . . resistance
11N . . . negative-voltage charge pump
11P . . . positive-voltage charge pump
12 . . . level shifter
13N . . . VSS monitor
13P . . . VSS monitor
14 . . . logic circuit
15, 15N, 15P . . . switch
16 . . . regulator circuit
17 . . . reference voltage generation circuit
18 . . . hysteresis comparator
19 . . . radio-frequency power amplifier
20 . . . RF switch (voltage-supplied circuit)
21 . . . antenna
22 . . . RF switch control circuit
23 . . . radio-frequency low-noise amplifier
101, 103, 104, 105, 107A, 107B, 108 . . . radio-frequency circuit module

The invention claimed is:

1. A voltage supply circuit configured to control a supply of a predetermined voltage to a voltage-supplied circuit, the voltage supply circuit comprising:

a level shifter circuit configured to selectively output one of at least two voltage inputs;

a charge pump circuit configured to transform a voltage of an input power supply and to apply a transformed voltage to the level shifter as one of the at least two voltage inputs; and a charge pump control circuit configured to cause the charge pump circuit to perform a continuous operation when the voltage supply circuit operates in an on-mode and to perform an intermittent operation when the voltage supply circuit operates in an off-mode, wherein the predetermined voltage is not supplied to the voltage-supplied circuit when the voltage supply circuit operates in the off-mode, and the predetermined voltage is supplied to the voltage-supplied circuit when the voltage supply circuit operates in the on-mode.

2. The voltage supply circuit according to claim 1, wherein the charge pump control circuit is further configured to detect an output voltage of the charge pump circuit and to cause the charge pump circuit to perform the intermittent operation in response to sensing that the output voltage of the charge pump circuit reaches a threshold.

3. The voltage supply circuit according to claim 2, wherein the transformed voltage is a negative voltage, wherein the charge pump control circuit comprises:
   a first MOS-FET connected between the input power supply and an output of the charge pump circuit; and
   a first diode connected to a gate of the first MOS-FET and connected between the output of the charge pump circuit and ground, and
wherein the threshold is a forward voltage drop produced by the first diode.

4. The voltage supply circuit according to claim 2, wherein the transformed voltage is a negative voltage,
wherein the charge pump control circuit comprises a resistive voltage divider circuit configured to divide a voltage difference between the output voltage of the charge pump circuit and the voltage of the input power supply, and
wherein the threshold is an output voltage of the resistive voltage divider circuit.

5. The voltage supply circuit according to claim 2, wherein the transformed voltage is a positive voltage,
wherein the charge pump control circuit comprises:
   a first MOS-FET connected between the input power supply and an output of the charge pump circuit; and
   a first diode connected to a gate of the first MOS-FET and connected between the output of the charge pump circuit and ground, and
wherein the threshold is a forward voltage drop produced by the first diode.

6. The voltage supply circuit according to claim 2, wherein the transformed voltage is a positive voltage,
wherein the charge pump control circuit comprises a resistive voltage divider circuit configured to divide a voltage difference between the output voltage of the charge pump circuit and ground, and
wherein the threshold is an output voltage of the resistive voltage divider circuit.

7. The voltage supply circuit according to claim 3, wherein the charge pump control circuit further comprises a second MOS-FET,
wherein the diode comprises a plurality of diodes; and
wherein the second MOS-FET is connected in parallel to at least one among the plurality of diodes.

8. The voltage supply circuit according to claim 5,
wherein the charge pump control circuit further comprises a second MOS-FET,
wherein the diode comprises a plurality of diodes; and
wherein the second MOS-FET is connected in parallel to at least one among the plurality of diodes.

9. The voltage supply circuit according to claim 4,
wherein the charge pump control circuit further comprises:
- a hysteresis comparator connected between the input power supply and ground; and
- a reference voltage supply circuit connected to the hysteresis comparator and configured to output a reference voltage, and wherein the hysteresis comparator is configured to compare the output voltage of the resistive voltage divider circuit and the reference voltage.

10. The voltage supply circuit according to claim 6,
wherein the charge pump control circuit further comprises:
- a hysteresis comparator connected between the input power supply and ground; and
- a reference voltage supply circuit connected to the hysteresis comparator and configured to output a reference voltage, and wherein the hysteresis comparator is configured to compare the output voltage of the resistive voltage divider circuit and the reference voltage.

11. The voltage supply circuit according to claim 7,
wherein the plurality of diodes comprise a diode-connected MOS-FET, and
wherein a gate of the diode-connected MOS-FET is connected to the gate of the first MOS-FET.

12. The voltage supply circuit according to claim 8,
wherein the plurality of diodes comprise a diode-connected MOS-FET, and
wherein a gate of the diode-connected MOS-FET is connected to the gate of the first MOS-FET.

13. The voltage supply circuit according to claim 1,
wherein the charge pump circuit comprises an enable terminal, and
wherein the charge pump control circuit is configured to control an operation state of the charge pump circuit in accordance with a signal output by the charge pump control circuit and supplied to the enable terminal of the charge pump circuit.

14. The voltage supply circuit according to claim 1,
wherein the charge pump control circuit comprises a switch configured to selectively apply the voltage of the input power supply to the charge pump circuit, and to control an operation state of the charge pump circuit in accordance with a state of the switch.

15. The voltage supply circuit according to claim 1,
wherein the charge pump circuit is configured to apply at least two voltage inputs to the level shifter by transforming the voltage of the input power supply.

16. A radio-frequency circuit module comprising:
- an RF switch configured to selectively supply a radio-frequency signal in accordance with a control voltage; and
- the voltage supply circuit according to claim 1, the voltage supply circuit being configured to supply the control voltage to the RF switch.

\* \* \* \* \*

UNITED STATES PATENT AND TRADEMARK OFFICE
CERTIFICATE OF CORRECTION

| | | |
|---|---|---|
| PATENT NO. | : 10,931,193 B2 | Page 1 of 1 |
| APPLICATION NO. | : 16/735040 | |
| DATED | : February 23, 2021 | |
| INVENTOR(S) | : Masamichi Tokuda et al. | |

It is certified that error appears in the above-identified patent and that said Letters Patent is hereby corrected as shown below:

In the Specification

Column 13, Line 34, "R1 and the re-channel" should read -- R1 and the n-channel --.

Column 14, Line 50, "in connecting an re-channel" should read -- in connecting an n-channel --.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*